US011694006B2

(12) United States Patent
Thakur et al.

(10) Patent No.: US 11,694,006 B2
(45) Date of Patent: Jul. 4, 2023

(54) ADVANCED TECHNIQUE FOR SCREENING ENHANCED OIL RECOVERY AND IMPROVED OIL RECOVERY METHODOLOGIES FOR A PETROLEUM RESERVOIR

(71) Applicant: University of Houston System, Houston, TX (US)

(72) Inventors: Ganesh C. Thakur, Houston, TX (US); Sriram Balasubramanian, Houston, TX (US); Ahmed M. Alzahabi, Houston, TX (US); Sushanta Bose, Katy, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 746 days.

(21) Appl. No.: 16/612,563

(22) PCT Filed: May 9, 2018

(86) PCT No.: PCT/US2018/031911
§ 371 (c)(1),
(2) Date: Nov. 11, 2019

(87) PCT Pub. No.: WO2018/213083
PCT Pub. Date: Nov. 22, 2018

(65) Prior Publication Data
US 2020/0202060 A1      Jun. 25, 2020

Related U.S. Application Data

(60) Provisional application No. 62/506,108, filed on May 15, 2017.

(51) Int. Cl.
*G06F 30/28*      (2020.01)
*C09K 8/594*      (2006.01)
(Continued)

(52) U.S. Cl.
CPC .............. *G06F 30/28* (2020.01); *C09K 8/594* (2013.01); *E21B 43/164* (2013.01); *E21B 43/20* (2013.01); *G06Q 50/02* (2013.01)

(58) Field of Classification Search
CPC ....... G06F 30/28; C09K 8/594; E21B 43/164; E21B 43/20; G06Q 50/02
See application file for complete search history.

(56) References Cited

U.S. PATENT DOCUMENTS 3,548,940 A   12/1970   Reguera et al.
3,800,874 A    4/1974   Kern
(Continued)

FOREIGN PATENT DOCUMENTS

WO     2015/058164 A1      4/2015
WO     2016/073810 A1      5/2016
WO   WO-2016073810 A1  *  5/2016  ......... E21B 41/0092

OTHER PUBLICATIONS

International Patent Application No. PCT/US2018/031911 International Search Report and Written Opinion dated Jul. 23, 2018 (14 pages).

(Continued)

*Primary Examiner* — Toan M Le
*Assistant Examiner* — Xiuqin Sun
(74) *Attorney, Agent, or Firm* — Conley Rose, P.C.

(57) ABSTRACT

A method for enhanced oil recovery may comprise inputting into a computer system data related to properties of a hydrocarbon reservoir and depletion of the hydrocarbon reservoir; calculating, with the computer system, a current oil saturation and a current gas saturation of the hydrocarbon (Continued)

reservoir based on the data; determining, with the computer system, that the current reservoir pressure is less than a bubble point pressure based on the data; calculating, with the computer system, a time to repressure the hydrocarbon reservoir by waterflooding based on the data; comparing, with the computer system, the data related to properties of the hydrocarbon reservoir to oil recovery screening criteria; selecting a flooding technique from a plurality of flooding techniques, with the computer system, based on satisfying the oil recovery screening criteria with the data related to properties of the hydrocarbon reservoir.

8 Claims, 6 Drawing Sheets

(51) Int. Cl.
*E21B 43/16* (2006.01)
*E21B 43/20* (2006.01)
*G06Q 50/02* (2012.01)

(56) References Cited

U.S. PATENT DOCUMENTS

| | | |
|---|---|---|
| 2006/0289157 A1 | 12/2006 | Rao |
| 2007/0068647 A1 | 3/2007 | Turta et al. |
| 2009/0205823 A1 | 8/2009 | Mohanty et al. |
| 2010/0300682 A1* | 12/2010 | Thakur ............... E21B 43/00 166/250.01 |
| 2015/0060075 A1 | 3/2015 | Blom et al. |

OTHER PUBLICATIONS

Shokrollahi et al., "Intelligent model for prediction of CO2—Reservoir oil minimum miscibility pressure," Fuel, 112, (2013), pp. 375-384, SciVerse Science Direct, 2013, retrieved on Jul. 6, 2018, retrieved from the internet: <URL:https://s3.amazonaws.com/academia.edu.documents/46865913/>.

* cited by examiner

ADVANCED TECHNIQUE FOR SCREENING ENHANCED OIL RECOVERY AND IMPROVED OIL RECOVERY METHODOLOGIES FOR A PETROLEUM RESERVOIR

CROSS-REFERENCE TO RELATED APPLICATIONS

The present application is a National Phase Entry of, and claims priority to PCT Application No. PCT/US2018/031911, filed May 9, 2018, which claims priority to U.S. Provisional Patent Application No. 62/506,108, filed May 15, 2017, the entire contents of each being hereby incorporated herein by reference in their entirety for all purposes.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Oil field development may pass through several phases to maximize hydrocarbon recovery: primary, secondary, and tertiary (enhanced). Primary recovery typically refers to a development of an oil field under its natural producing mechanisms, i.e., liquid and rock expansion and solution gas drive. Secondary recovery, also known as improved oil recovery ("IOR") generally refers to augmenting the natural energy by injecting fluids. Tertiary recovery typically encompasses enhanced oil recovery ("EOR") methods that may use external sources of energy and materials to recover oil that cannot be produced economically by conventional means of the primary and secondary recovery. Nearly a third to half of the world's oil is left behind and remains to be recovered from the world's oil fields after primary and secondary recovery methods.

SUMMARY OF THE DISCLOSURE

In an embodiment, a method for screening enhanced and improved oil recovery in hydrocarbon reservoirs may comprise inputting into a computer system data related to properties of a hydrocarbon reservoir and depletion of the hydrocarbon reservoir; calculating, with the computer system, a current oil saturation and a current gas saturation of the hydrocarbon reservoir based on the data; determining, with the computer system, that a current reservoir pressure is less than a bubble point pressure based on the data; calculating, with the computer system, a time to repressurize/repressure the hydrocarbon reservoir by waterflooding based on the data; comparing, with the computer system, the data related to properties of the hydrocarbon reservoir to oil recovery screening criteria; selecting a flooding technique from a plurality of flooding techniques, with the computer system, based on satisfying the oil recovery screening criteria with the data related to properties of the hydrocarbon reservoir; and flooding the hydrocarbon reservoir.

In an embodiment, a method for enhanced and improved oil recovery may comprise calculating, with a computer system, a current oil saturation of a reservoir; comparing, with the computer system, reservoir properties to screening criteria; determining, with the computer system, a minimum miscibility pressure based on correlations between the reservoir properties and the screening criteria; determining, with the computer system, that the minimum miscibility pressure is greater than a bubble point pressure of the reservoir and is less than or equal to an initial reservoir pressure; determining, with the computer system, the time to repressurize/repressure the reservoir with water injection; performing a reservoir simulation with the computer system; and flooding the reservoir.

In an embodiment, a method for enhanced and improved oil recovery may comprise inputting into a computer system depletion data and rock and fluid properties of a reservoir; computing, with the computer system, a difference between a producing current gas-oil ratio and a solution gas-oil ratio to provide a free gas oil ratio; referring, with the computer system, to a gas-oil relative permeability curve of the reservoir; matching, with the computer system, the free gas oil ratio to a gas saturation on the gas-oil relative permeability curve to provide a free gas saturation; calculating, with the computer system, a current oil saturation of the hydrocarbon reservoir; determining, with the computer system, that the current reservoir pressure is less than a bubble point pressure; calculating, with the computer system, a time to repressurize/repressure the hydrocarbon reservoir by waterflooding; calculating, with the computer system, a number of wells for waterflooding; comparing, with the computer system, the data related to properties of the hydrocarbon reservoir to oil recovery screening criteria; selecting a flooding technique from a plurality of flooding techniques, with the computer system, based on satisfying the oil recovery screening criteria with the data related to properties of the hydrocarbon reservoir; flooding the reservoir; and recovering oil from the reservoir.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION OF DISCLOSED EXEMPLARY EMBODIMENTS

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or "approximately" or the like, when used with a number, may mean that specific number, or alternatively, a range in proximity to the specific number, as understood by persons of skill in the art field; and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

Abbreviations used throughout the disclosure may be as follows: $P_b$=bubble point pressure, psia; P=current reservoir pressure, psia; $S_g$=Gas saturation, %; $S_o$=Oil saturation, %; WF=Waterflooding; $N_p$=Cumulative produced oil, STB (stock tank barrel); $R_s$=solution gas-oil ratio, scf/STB (standard cubic feet per stock tank barrel); N=Original Oil in Place, STB; $G_p$=Cumulative produced gas, scf; $R_p$=Producing current gas-oil ratio, scf/STB; T=temperature, °F.; $\mu_o$=oil viscosity, cP; D=depth, ft.; k=permeability, md; Ø=porosity, %; H=thickness, ft.

This disclosure relates generally to techniques for screening EOR and/or IOR methodologies for a petroleum reservoir. Currently, there is no comprehensive method to screen enhanced oil recovery methods/techniques incorporating static, dynamic, and operational parameters. Many methods currently available to screen for EOR may consider only a subset of the parameters and do not consider the production performance of the reservoir. Systems and methods of this disclosure may solve the problem of screening for EOR methodologies by integrating current production performance indicators of an oil reservoir system and the geological description of the reservoirs. The systems and methods of this disclosure may take into account production parameters such as free gas oil ratio, free gas saturation, fluid composition, recovery factor, and/or time to repressurize/repressure a reservoir. In addition, geological heterogeneities and facies variations may be taken into account to determine if certain EOR techniques may be effective.

EOR methods may be classified as thermal (e.g., steam flooding, in-situ combustion) and non-thermal methods including chemical (e.g., polymer, surfactant, caustic, micellar/polymer) and miscible (e.g., hydrocarbon gas, $CO_2$, and nitrogen injection). IOR methods may refer to any process that is applied to increase the ultimate oil recovery from a petroleum reservoir. IOR may include physical, chemical and mechanical processes including infill drilling, waterflooding, gas injection, or combinations thereof.

The implemented EOR method may be specific and optimal to the reservoir and fluid properties of the oil field. Hence, screening variety of available EOR methods to select an appropriate method may be an initial step that may need to be completed before the project is implemented in the oil field.

The IOR/EOR methodologies under screening may include: waterflooding (with specific salinity); chemical (e.g., alkaline (A), polymer, surfactant/polymer (SP)); miscible (e.g., $CO_2$, gas injection, nitrogen, and flue gas); and/or thermal methods (e.g., steam flooding, in-situ combustion, and cyclic steam stimulation).

Factors such as reservoir structure, geological heterogeneity, fluid flow, well patterns, well spacing, and technology, in addition to operational and economical parameters (market), may affect the choice of IOR and EOR methodologies for a certain reservoir.

The reservoir under consideration may be screened for EOR techniques against the several factors mentioned above. This disclosure presents a workflow to screen EOR techniques combining geological, reservoir fluid and production parameters. The parameters evaluated may include minimum miscibility pressure ("MMP"), original oil-in-place ("OOIP"), oil rate, recovery factor, temperature, gas-oil ratio, gas saturation, oil viscosity, API gravity, fluid composition, time to repressurize/repressure the reservoir, depth, facies distribution, depositional setting (based on geological background), Dykstra-Parsons & Lorentz coefficients, reservoir thickness and/or formation type. The screening may be performed to assist in identifying additional opportunities to increase production and/or extend the life of the reservoir. It may be important to study the geological, reservoir, petrophysical, production and/or operational aspects to develop a successful EOR strategy.

In the past, engineers and practitioners typically waited until water and gas breakthrough to quantify the efficiency of the gas and waterflood performance. Analytical and numerical techniques aided with diagnostic plots (e.g., water-oil ratio ("WOR") and gas-oil ratio ("GOR") vs. time or produced oil ("Np")) have been extensively used by asset teams, in addition to analog methods to make sound decisions.

Several approaches may be employed to screen EOR methodologies with different criteria. The details of these screenings and their results are described below. Each approach identifies different sets of EOR techniques suitable for the reservoir mentioned above. These different sets of EOR techniques may have techniques common to each other, but the primary candidate(s) identified by each screening technique may be different. This may be an example of how different independent and exclusive approaches exist in the industry, and how these approaches can derive different screening results for the same reservoirs due to their inherent differences in the screening approach. The results from all of the approaches may be combined to arrive at the recommendations for obtaining an optimal EOR method that may fit the screened reservoir.

Approach 1: This process may evaluate the following reservoir rock and fluid properties: depth; thickness; permeability; temperature; oil API gravity; and oil viscosity. For each of these criteria, a certain cut off value or range may be required for a certain EOR technique to be effective. The fluid may be assumed to be light hydrocarbons with a composition of $C_1$-$C_7$, and the formation dip may be assumed to be zero degrees or a low dip angle (Low dip angles may include angles less than 5 degrees; high dip angles may include angles greater than 10 degrees). Each of the EOR methodologies may be given a score based on how many variables satisfied the screening criteria. Finally, the EOR techniques may be ranked based on that score to identify the best suited EOR technique. The results from this evaluation process on the parameters of a given reservoir X may be as follows, listed in order of decreasing suitability. Recommended EOR techniques may include: polymer flooding; alkaline flooding; $CO_2$ flooding; gas injection; nitrogen and flue gas flooding; surfactant/polymer flooding; thermal combustion; and steam flooding.

Approach 2: The United States Department of Energy ("DOE") provides a screening method based on the paper "Screening Criteria Revisited" by Taber, Martin, and Seright (1997). This screening method may also be implemented in a graphical user interface ("GUI") based tool by "Petroleum Solutions." Petroleum Solutions' tool (e.g., software) may first calculate the relative criteria fit to a certain given input data, and then may suggest a rank based on the percentage of match. The results of screening the best EOR technique for a given reservoir X is shown in FIG. 1.

Figure 1:
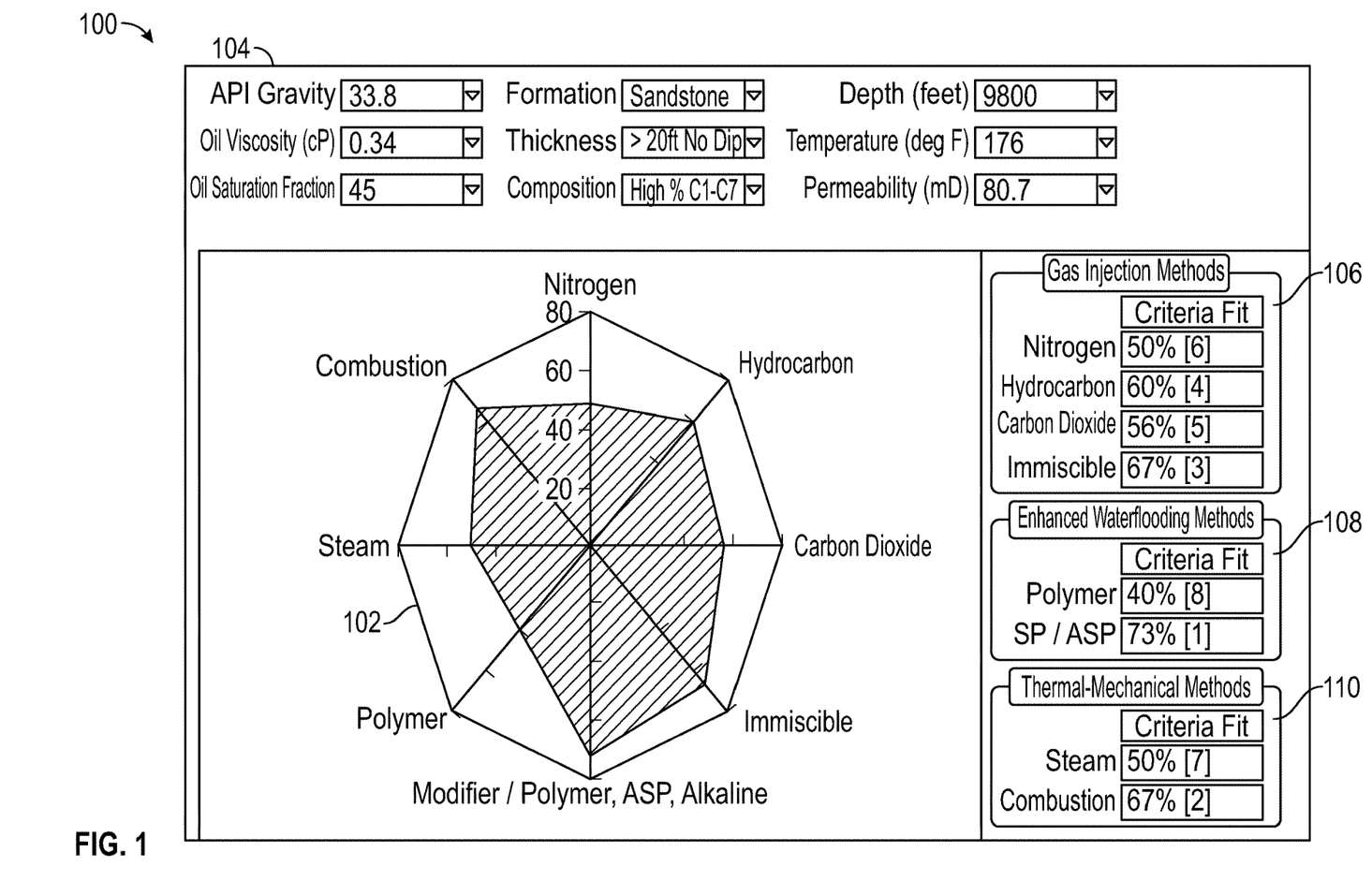
FIG. 1 illustrates an EOR recommendation based on a screening process in accordance with embodiments of the disclosure.

FIG. 1 is an example of a GUI 100 illustrating spider chart 102 that ranks EOR techniques (rank #1 being the most suitable/effective technique; rank #8 being the least suitable/ effective technique). Although, only eight EOR techniques are being ranked, it should be noted that more or less than eight EOR techniques can be ranked.

Toolbar or ribbon 104 illustrates screening criteria, such as, for example, API gravity of fluid in Reservoir X; oil viscosity (cP) of oil in Reservoir X; oil saturation fraction; formation type (geologic formation, e.g., sandstone, shale, carbonate, etc.); formation thickness (e.g., greater than 20 feet); fluid composition; depth of reservoir (e.g., true vertical depth and/or measured depth along a wellbore); temperature of the reservoir (e.g., 176° F.); and permeability of the formation (millidarcies, mD). Box 106 illustrates the effectiveness/suitability (criteria fit) of gas injection methods (for Reservoir X) based on the screening criteria shown in toolbar 104.

As shown in Box 106, the criteria fit for nitrogen injection (into Reservoir X) is 50% (overall ranking is #6); hydrocarbon injection (into Reservoir X) is 60% (overall ranking is #4); carbon dioxide injection (into Reservoir X) is 56% (overall ranking is #5); and immiscible gas injection (into Reservoir X) is 67% (overall ranking is #3).

As shown in Box 108, the criteria fit for enhanced waterflooding (into Reservoir X) with a polymer(s) is 40% (overall rank is #8); and surfactant-polymer ("SP") flooding or alkaline-surfactant-polymer flooding ("ASP") is 73% (overall rank is #1).

As shown in Box 110, the criteria fit for thermal-mechanical techniques is 50% for steam injection (into Reservoir X) (overall rank is #7); and is 67% for in situ combustion (within Reservoir X) (overall rank is #2).

The two approaches mentioned above may show that utilizing two different practices and approaches allows for two different sets of screening results for the same reservoir. This may be the case where Approach 3, an integrated and comprehensive screening method of the disclosure, is introduced. Approach 3 is different than Approach 1 and Approach 2, and may incorporate a vast array of reservoir and fluid parameters, geological parameters and/or comprehensive workflows to arrive at a solution. Approach 3 may be intended to eliminate the variety of results obtained by using different exclusive practices for selecting EOR screening. A description of Approach 3 along with its unique integrated approach may be presented as follows. There is currently no integrated method to screen enhanced oil recovery methods incorporating geological aspects along with static, dynamic, and operational parameters. Many methods currently available to screen for EOR may consider different subsets of parameters, and do not incorporate a comprehensive production performance of a reservoir.

Approach 3 (integrated and comprehensive screening method): This advanced process may incorporate a unique approach for evaluating important aspects of reservoir rock and fluid characteristics that may significantly impact the selection of various IOR and EOR techniques. This approach may include evaluation of the following parameters, in addition to other reservoir and fluid properties and geological characteristics: mobility ratio ("MR"); minimum miscibility pressure ("MMP"); initial and current GOR (Gas-Oil Ratio); and initial ($P_i$) and current reservoir pressures (P); bubble point pressure ($P_b$). This approach may evaluate the above mentioned parameters criteria and may provide additional inputs in which EOR techniques may be better suited for the reservoir under consideration. For example, this process may identify that an MR of about 0.30 for this reservoir may be favorable for performing a waterflood technique without the requirement of any polymer. Therefore, polymer flooding, an EOR technique, although identified in the other two approaches, may not be required for this reservoir. Cost may be reduced considerably through achieving the same results by use of a specific salinity waterflood (IOR) rather than using a polymer flood. Also, the injectivity with a waterflood may be higher, thus producing the reservoir at a much faster rate (significantly higher pore volume ("PV") injection per year). Achieving an effective waterflooding may be favorable with this range of MR. By implementing a successful waterflood with specific water salinity, other EOR techniques may be considered at a later time to further increase the recovery efficiency. Operational decisions may include shutting down some high water cut producing wells (e.g., EOR techniques may be utilized to produce fluid from a reservoir until the fluid contains at least 90% water), and/or converting some of the producing wells to injectors.

Approach 3 may solve the problem of screening for IOR/EOR methodologies by integrating current production performance indicators of the oil reservoir system and the geological description of the reservoirs. This approach may take into account the production parameters such as free gas oil ratio, gas saturation, fluid composition, recovery factor, and/or time to repressurize/repress the reservoir. In addition, geological heterogeneities and facies variations may also be taken into account to determine if certain IOR/EOR methods will be effective.

Geological factors that may affect success of an EOR may include geothermal gradient; structural framework; geologic facies variation (e.g., vertical and horizontal/lateral); type of the reservoir based on depositional environment (e.g., channel vs. delta) and/or reservoir rock and fluid properties (e.g., computation of free gas saturation).

Structural framework: Fault framework, or a combination of fault and depth structure may significantly impact a direction of movement of oil. This may assist in determining how large of an area can be influenced by the EOR and how many wells may be needed for the waterflood. EOR implementation may also be guided by the structural framework.

Geothermal gradient: the geothermal gradient may control the reservoir temperature. The cooler the reservoir, the more favorable it may be to attain miscibility of the injected gas with the oil. Therefore, the EOR processes such as gas injection may be governed by reservoir temperature.

Geologic facies variation (vertical and horizontal/lateral): Carbonate and siliciclastic deposits may have their inherent differences which may drive the design of the EOR process. In a carbonate reservoir, the permeability variation may be highly heterogeneous and anisotropic. The dominance of secondary porosity may depend on the diagenesis. Therefore, in a carbonate reservoir, the pattern may be complex and the number of infill wells may be much more than the siliciclastic system. In siliciclastic systems (i.e., quartz and feldspar-rich) on the other hand, reservoir quality may be governed by the primary porosity and permeability distribution due to facies variation which in turn may depend on the primary depositional environment. Certain depositional environments may have specific kind, scale and direction of facies variations.

Vertical variation: Vertical facies change or compartmentalization may depend on facies stacking. Several channels may stack to create a thick deposit of quality reservoir rock, however, a detailed geological description may define the flooding surfaces (and be supported by engineering data) in between and thus, the compartmentalization. Sequence stratigraphic boundaries within the reservoirs may need to be defined previously to govern Approach 3. If fining upward (meandering river, retrogradational delta package and similar), then IOR or EOR processes that include liquid injection (e.g., waterflooding, polymer, and ASP (alkaline/surfactant/polymer)) may not be as favorable as in a coarsening upward sequence. This may be attributed to the inherent vertical rock property variations. If coarsening upward, then any IOR or EOR process that drives the oil upward, such as, waterflooding, polymer or ASP, may be favored as the oil may move into a better quality reservoir due to natural buoyancy. An upward-increasing grain size profile may be characteristic for mouth bars. The lower parts may be finer grained, more poorly sorted, and with common shale intercalations. Upward, the texture may be coarser, although there may be many laminations of clays and organic material. Permeability may increase upward.

Lateral/Horizontal Variation: Lateral variation of reservoir properties may depend on the type of depositional environment, e.g., a low sinuosity channel belt has smaller lateral continuity compared to a braided river or a highly sinuous river. Some large oil fields including the Prudhoe Bay field in Alaska and several giant oil fields in the Sirte basin of Libya, are known to be of braided river settings. The scale of the reservoir distribution may be critical in planning for IOR and/or EOR processes to be effective. The scale and reservoir heterogeneity may control the number of wells needed for the successful EOR. Tables 1 and 2 illustrate examples of scales for certain sedimentary environments.

TABLE 1

Width and thickness relationships of fluvial sediments in various settings.

| Depositional environment | Thickness | Width |
|---|---|---|
| Braided and low sinuosity rivers | 1-1200 m (3-3937 ft); most <60 m (197 ft); common range 5-60 m (16-197 ft) | 50 m-1300+ km (164 ft-808+ mi); many >1 km (0.62 mi); common range 0.5-10 km (0.3-6 mi) |
| Meandering rivers | 1-38 m (3-125 ft); common range 4-20 m (13-65 ft) | 30 m-15 km (98 ft-9 mi); most <3 km (1.8 mi); common range 0.3-3 km (0.1-1.8 mi) |
| Delta distributaries | 1-35 m (3-115 ft); most <20 m (65 ft); common range 3-20 m (10-65 ft) | 3 m-1 km (10 ft-0.6 mi); most <500 m (1640 ft); common range 10-300 m (33-984 ft) |
| Channels in eolian settings | 1-19 m (3-62 ft) | 2.5-1500 m (8.2-4921 ft); most <150 m (492 ft) |
| Valley fills on bedrock unconformities | 12-1400 m (39-4593 ft); most <500 m (1640 ft) | 75 m-52 km (246 ft-32 mi); most <10 km (6 mi) |
| Valley fills within alluvial and marine strata | 2-210 m (6-689 ft); most <60 m (197 ft) | 0.1-105 km (0.06-65 mi); common range 0.2-25 km (0.1-15 mi) |

TABLE 2

Statistics of dimensional data for deltaic sandstone bodies in meters.

| Sand Body Type | Width | | | Length | | | Thickness | | | N |
|---|---|---|---|---|---|---|---|---|---|---|
| | Mean | Max. | Min. | Mean | Max. | Min. | Mean | Max. | Min. | |
| Incised valleys | 9843 | 63,000 | 500 | — | — | — | 30.3 | 152 | 2 | 91 |
| Fluvial channels | 755 | 1400 | 57 | — | — | — | 9 | 24 | 2.5 | 6 |
| Distributary channels | 518 | 5900 | 20 | — | — | — | 7.8 | 40 | 1 | 268 |
| All types of systems tracts | 25,365 | 106,000 | 1600 | 93,166 | 190,000 | 47,000 | 19.1 | 49 | 2.7 | 67 |
| Highstand systems tract | 16,425 | 43,000 | 16,000 | — | — | — | — | — | — | 36 |
| Transgressive systems tract | 7150 | 20,000 | 3300 | — | — | — | — | — | — | 5 |
| Distributary mouth bars | 2868 | 14,000 | 1100 | 6477 | 9600 | 2400 | 9.7 | 42 | 1.2 | 26 |
| Flood tidal delta complex | 6201 | 13,700 | 1700 | 12,300 | 25,700 | 2900 | 6.7 | 23 | 1.8 | 13 |

TABLE 2-continued

Statistics of dimensional data for deltaic sandstone bodies in meters.

| Sand Body Type | Width | | | Length | | | Thickness | | | |
|---|---|---|---|---|---|---|---|---|---|---|
| | Mean | Max. | Min. | Mean | Max. | Min. | Mean | Max. | Min. | N |
| Crevasse channels | 58 | 400 | 5 | — | — | — | 2.4 | 17 | 0.2 | 44 |
| Crevasse splays | 787 | 7700 | 18 | 5577 | 11,700 | 160 | 1.4 | 12 | 0.3 | 84 |
| Lower tidal flat | 994 | 1550 | 400 | — | — | — | 4.6 | 9 | 2 | 14 |
| Tidal creeks | 813 | 1550 | 161 | — | — | — | 5.2 | 18 | 1 | 15 |
| Tidal inlet | 1850 | 2550 | 700 | 4300 | 4300 | — | 4.8 | 7 | 3 | 3 |
| Estuary mouth shoal | 2400 | 2900 | 1700 | 3750 | 4700 | 2200 | 10 | 35 | 10 | 4 |
| Chenier | 3650 | 6400 | 900 | 21,758 | 38,600 | 49,000 | 5.8 | 7 | 4.6 | 2 |
| All sands | 5094 | 106,000 | 5 | 35,313 | 190,000 | 160 | — | — | — | 671 |

The type of depositional environment may affect the broader geologic control on the fluid storage and movement within the reservoir. It also may control the extent of the reservoir and connectivity. Prior to reviewing geological correlations, a depositional environment may assist in inferring the general information and range of extent, connectivity and the direction of connectivity.

Reservoir rock and fluid properties: The typical reservoir rock and fluid properties that have been used to screen the IOR/EOR methods may be gravity (e.g., API), viscosity, composition, oil saturation, formation type, net thickness, average permeability, depth and/or temperature. Approach 3 may take into account the free gas saturation, production performance parameters such as free gas oil ratio, bubble point pressure, initial and current reservoir pressures, mobility ratio and/or minimum miscibility pressure.

Approach 3 may begin with computing the current oil saturation by applying a material balance equation. First method for calculating gas saturation from a material balance: The free gas saturation ($S_g$) can be computed from material balance as follows. The first step involves the calculation of oil saturation ($S_o$) from a material balance equation ("MBE"). The current oil saturation may be calculated by an MBE as:

$$S_o = (1 - S_w)(1 - N_p/N)(B_o/B_{oi}) \quad (1)$$

where $S_w$=Water saturation at start of waterflood; $N_p$=Cumulative oil production at start of waterflood; N=Initial Oil in Place, STB; $B_{oi}$=Initial oil formation volume factor ("FVF"), RB/STB (reservoir barrel per stock tank barrel); $B_o$=Oil FVF at start of waterflood, RB/STB.

If $S_o$<40%, it may be difficult to make a waterflood work. If the waterflood does not work then it may be almost impossible to make LSWF (low salinity waterflood), polymer flood or ASP (Alkaline Surfactant Polymer) to work. If $S_g = 1 - S_w - S_o$ is greater than 30% it may be difficult to make waterfloods work in most cases. If P<$P_i$ and $P_b$, the time for waterflood (or water injection) to reach from its current low pressure to $P_b$ or $P_i$ may be calculated. If this time length is reasonable (t<5 years), then there may be an opportunity to repressurize/repressure the reservoir. After repressurizing/repressuring the reservoir, LSWF, polymer flood and/or ASP may have opportunities to work.

Second method for calculating free gas saturation, $S_g$ from $(R_p - R_s)$=free gas-oil ratio ("GOR"): An alternative method to calculate free gas saturation $S_g$ may be to use the production performance and rock and fluid properties. The free gas oil ratio from production can be computed as the difference between the producing current gas-oil ratio and solution gas-oil ratio. The free gas oil ratio can be obtained from rock and fluid properties as the mobility ratio of gas to oil times the ratio of formation value factor of oil to formation value factor of gas. This method is explained below in detail.

$$C_1 = (R_p - R_s) = \text{Free Gas Oil Ratio ("GOR")} \quad (2)$$

where $R_p = Q_g/Q_o$=Producing current gas production rate/Current oil production rate=Equation 3=Equation 4=Equation 5.

$$C_1 = \frac{\frac{k_{rg}}{\mu_g B_g}}{\frac{k_{ro}}{\mu_o B_o}} = \frac{k_{rg}}{k_{ro}} \times \frac{\mu_o B_o}{\mu_g B_g} \quad (3)$$

$$C_1 = \frac{k_{rg}}{k_{ro}} \times C_2 \quad (4)$$

$$\frac{k_{rg}}{k_{ro}} = \frac{C_1}{C_2} \quad (5)$$

Figure 2:
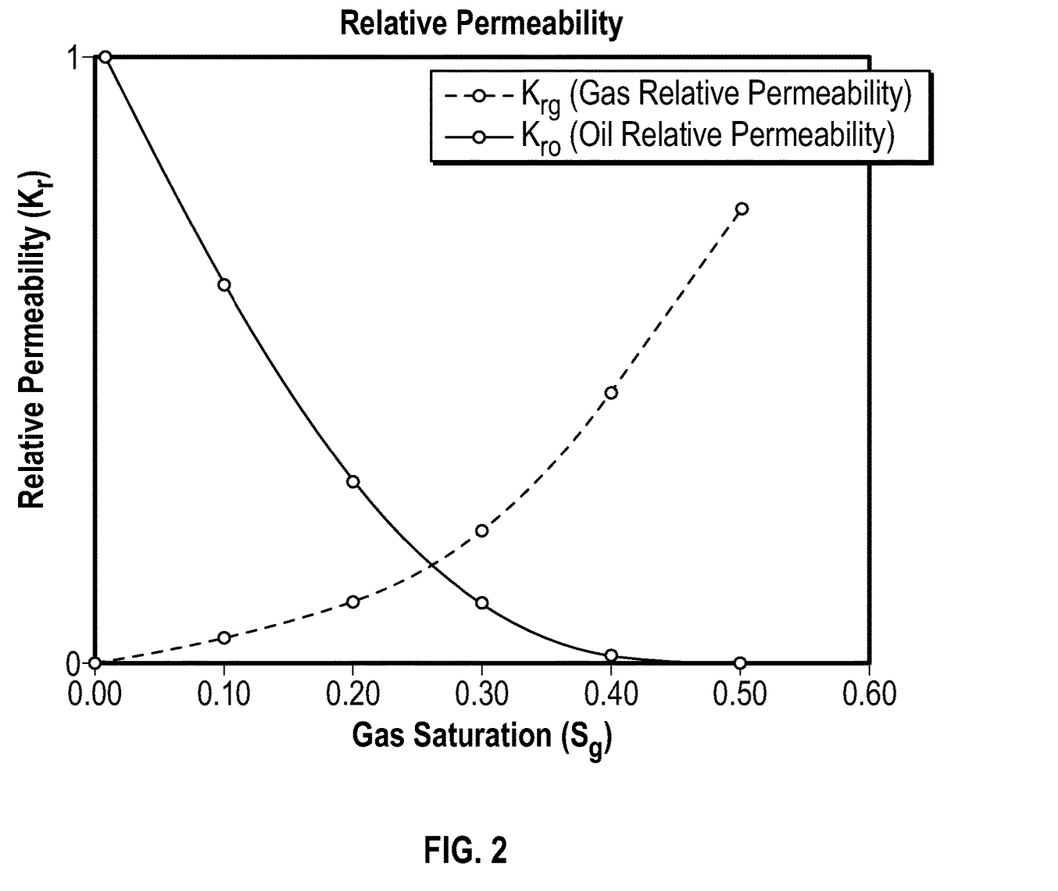
FIG. 2 illustrates a relative permeability curve for a reservoir in accordance with embodiments of the disclosure.

The next step may be to refer to the gas-oil relative permeability curve of the given reservoir. For a given free gas saturation $S_g$, the ratio $k_{rg}/k_{ro}$ can be computed from the relative permeability curves, as shown in FIG. 2. The gas saturation that corresponds to the free gas oil ratio can be found by trial and error by matching the $k_{rg}/k_{ro}$ computed using the Equations (2)-(5). If a/b=$C_1/C_2$; then $S_g$ can be determined by a "trial and error" method and by the use of FIG. 2. $\mu_o$=oil viscosity at the start of waterflood, cP; $\mu_g$=gas viscosity at the start of waterflood, cP; $B_o$=oil FVF, at start of waterflood, RB/STB; $B_g$=gas FVF, at start of waterflood, RB/MSCF (reservoir barrel per thousand standard cubic feet). The $S_g$ calculation by the two different methods may be compared: this comparison may provide a quality check for the PVT (pressure, volume, temperature) data. If the current reservoir pressure>bubble point pressure ($P_b$), no free gas in the formation and GOR=$R_{si}$ may be expected. As reservoir pressure reaches $P_b$, gas may start to move after gas saturation reaches critical gas saturation. Equation 6 shows how to calculate GOR.

$$GOR = R_s + \left\{ \frac{k_{rg}}{k_{ro}} \frac{\mu_o}{\mu_g} \times \frac{B_o}{B_g} \right\} \times 1000 \quad (6)$$

Figure 3:
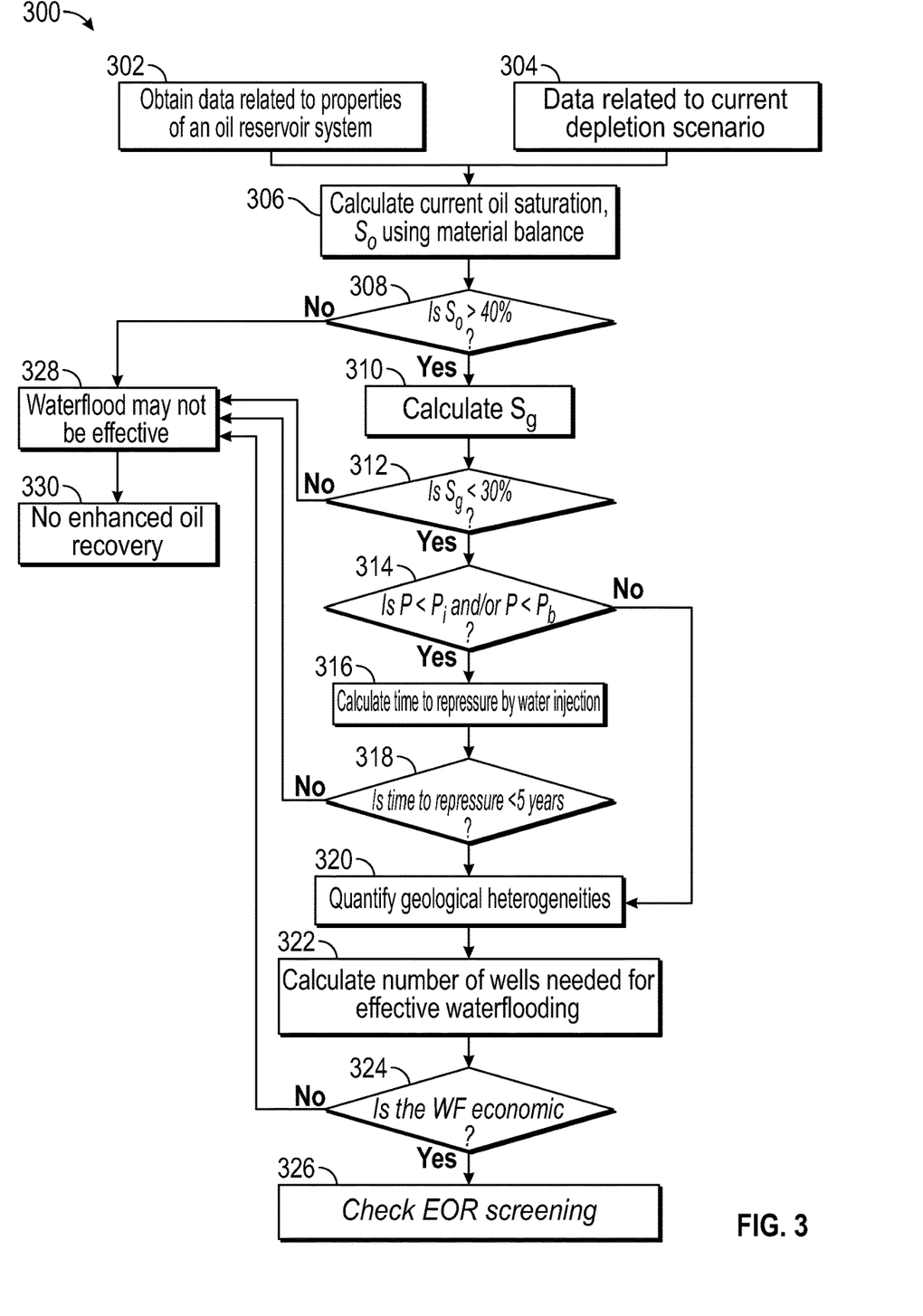
FIG. 3 illustrates a flowchart for EOR screening in accordance with embodiments of the disclosure.
Figure 4:
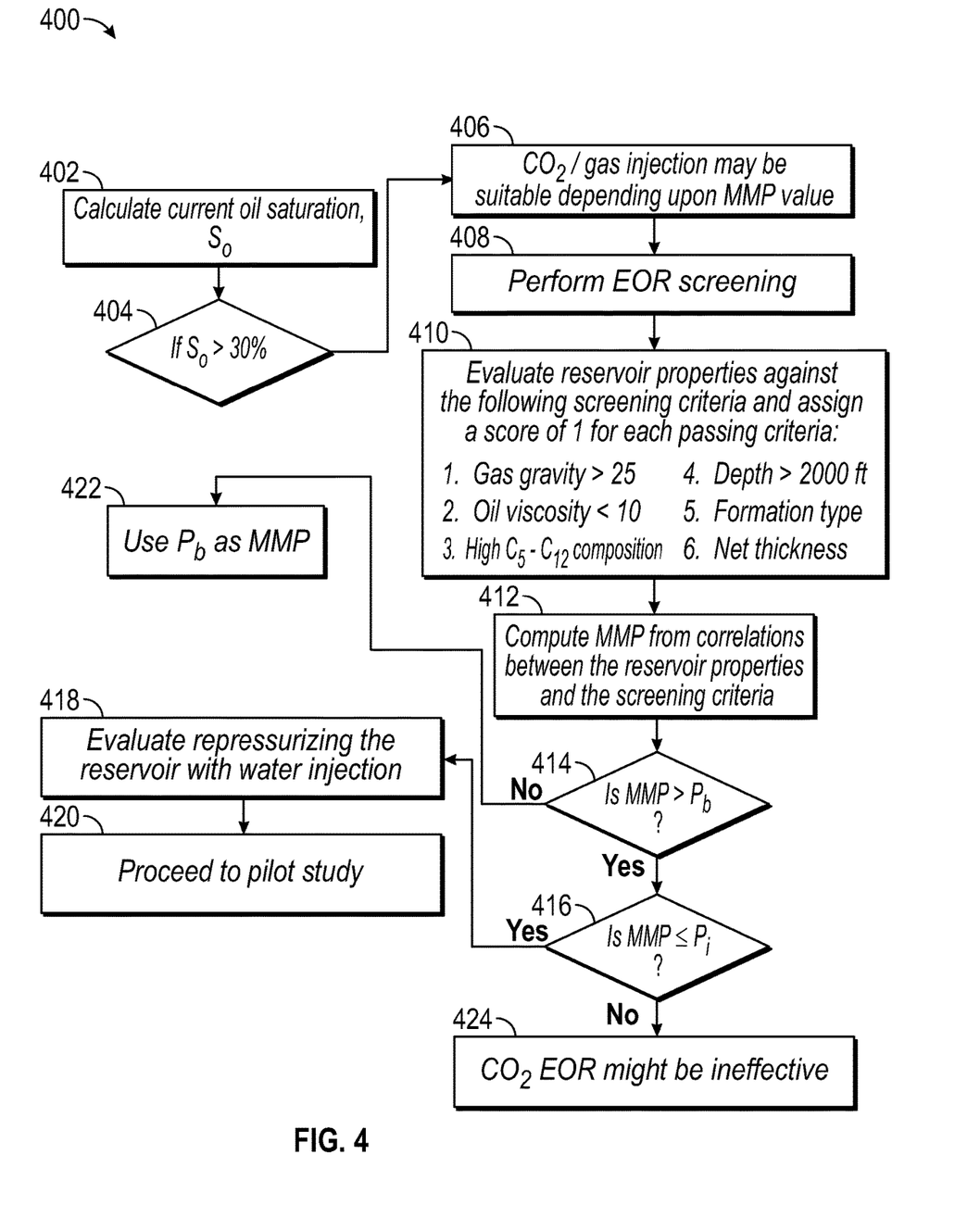
FIG. 4 illustrates a flowchart for $CO_2$-EOR screening in accordance with embodiments of the disclosure.

FIGS. 3 and 4 illustrate the steps of the implementation of the advanced EOR method identified above as Approach 3. This advanced EOR method may start with obtaining properties and data related to the depletion strategy of the reservoir under study. Then, current oil saturation and/or gas saturation may be calculated using the techniques described above. The next steps may include comparisons of the $P_b$, P, $P_i$ to determine the time to repressurize/repressure a reservoir by water injection. All of these together may help to determine if the waterflood is going to be effective. If the waterflood is effective, one may need to further delve deeper and define the geologic heterogeneities which may help to determine the number of wells and their patterns needed to be drilled. This may determine if the project of WF (waterflood) is economic. An economic WF may mean better opportunity for an EOR to be successful.

Referring to FIG. 3, an example of an advanced EOR workflow 300 is described as follows: 1) obtaining data related to properties of an oil/gas reservoir (Box 302) and data related to a current depletion scenario (Box 304); 2) calculating current oil saturation of reservoir, $S_o$, using material balance (Box 306); 3) determining if $S_o$ is greater than 40% (Diamond 308): if $S_o$ is greater than 40%, then 4) calculating gas saturation, $S_g$ (Box 310); 5) determining if $S_g$ is less than 30% (Diamond 312): if $S_g$ is less than 30%, then 6) determining if the current reservoir pressure, P, is less than an initial reservoir pressure, $P_i$, and/or P is less than the reservoir bubble point pressure, $P_b$ (Diamond 314): if P is less than $P_i$ and/or P is less than $P_b$, then 7) calculating time to repressurize/repressure the reservoir by water injection (Box 316); 8) determining if time to repressurize/repressure reservoir is within a certain time period, X (e.g., X<5 years) (Diamond 318); 9) Quantifying geologic heterogeneities of the reservoir (Box 320); 10) Calculating number of wells needed to effectively waterflood the reservoir (Box 322); 11) determining if the waterflood is economical (Diamond 324); and 12) performing EOR screening (screening criteria).

If $S_o$ is less than 40% at Box 308, then a waterflood may not be effective (Box 328) and there is no enhanced oil recovery (Box 330). If $S_g$ is greater than 30% (at Diamond 312), then a waterflood is ineffective (Box 328) and there is no enhanced oil recovery (Box 330). If the time to repressurize/repressure (Diamond 318) the reservoir is not within a desired time period X, then a waterflood is ineffective (Box 328) and there is no enhanced oil recovery (Box 330). If the waterflood is not economical (at Diamond 324), then the waterflood is ineffective (Box 328) and there is no enhanced oil recovery (Box 330).

Referring to FIG. 4, another example of an advanced EOR workflow 400 is described as follows: 1) calculating oil saturation $S_o$ of a reservoir (Block 402); 2) determining if $S_o$ (in the reservoir) is greater than 30% (Diamond 404): if $S_o$ is greater than 30%, then 3) gas injection (e.g., $CO_2$) may be suitable (depending upon minimum miscibility pressure ("MMP") of the reservoir)(Box 406); 4) performing EOR screening (Box 408); 5) evaluating reservoir properties against the following screening criteria and assigning a score of 1 for each passing criteria (Box 410): 1. Oil gravity >25; 2. Oil Viscosity <10 cP; 3. High $C_5$-$C_{12}$ composition (e.g., a $C_5$ through $C_{12}$ composition greater than 15% by weight of oil); 4. Depth >2,000 ft; 5. Formation Type; and 6. Net thickness of formation. Box 412 includes computing MMP from correlations between the reservoir properties and the screening criteria. Then, at Diamond 414: determining the bubble point pressure of the reservoir, $P_b$: if MMP is greater than $P_b$, then the next step (Diamond 416) is to determine if MMP is less than or equal to the initial reservoir pressure, $P_1$. If MMP is less than or equal to $P_1$, then the next step (Box 418) is evaluating repressurizing/repressuring the reservoir with water injection and then proceeding to a pilot study (Box 420).

If MMP is less than $P_b$ (at Box 414) then $P_b$ may be utilized as the MMP (Box 422). If MMP is greater than $P_1$, then $CO_2$ EOR may be ineffective (Box 424).

The advanced EOR screening approach (Approach 3) may be applied to multiple reservoirs to select the most applicable EOR methods based on the reservoir properties. The reservoir rock and fluid properties of one of the reservoirs is listed in Table 3.

TABLE 3

Reservoir data used in the application for EOR screening using the Approach 3 screening criteria.

| Parameters | |
|---|---|
| Thickness, ft | 89 |
| Porosity, % | 21 |
| Permeability, md | 231 |
| Depth, ft | 9,474 |
| Oil viscosity, cP | 0.41 |
| Temperature, ° F. | 172 |
| Initial Reservoir Pressure, psia | 4,147 |
| Current Reservoir Pressure, psia | 3,653 |
| Bubble Point pressure, psia | 3,755 |
| Formation Water Salinity, ppm (parts per million) | 2,157 |
| Oil Gravity (°API) | 31.4 |
| $S_{wi}$, % (initial water saturation percentage) | 30 |
| Calculated Parameters | |
| $S_o$, % (oil saturation percentage) | 51.6 |
| $S_g$, % (gas saturation percentage) | 18.4 |
| GOR (gas oil ratio), scf/STB | 2,346 |
| MR (mobility ratio) | 0.3 |

Approach 3 may be applied to one section of the field to screen for IOR/EOR methodologies. Although there may be multiple competing techniques that may increase oil recovery, specific salinity waterflooding may be chosen as a preferred technique for improved recovery where a reservoir may have a favorable mobility ratio of 0.3. This reservoir may be a fine grained sandstone deposited in a deltaic channel environment. Therefore, the fine grained unconsolidated sandstones may have a reservoir with properties (e.g., porosity above 25% and permeability more than 200 md) sufficient for the waterflood. However, these may be fining upward sequences, grading into a shale cap on top. In order to be a suitable candidate for the EOR with polymer or similar liquids, the preferable type of rocks may have to have coarse grained sandstone to give rise to a high quality reservoir. Due to the inherent nature of stacked channel sands, the vertical connectivity may be lower than the lateral connectivity. The different flow units may be connected only at the fault zones due to overlapping. However, an EOR method to work more favorably may require better vertical connectivity. The oil production of this section of the reservoir may increase by 150% (Table 4) by implementing specific salinity waterflood only. A favorable mobility ratio (~0.3) may be conducive for successful specific salinity waterflooding (e.g., injected water salinity 1,000 ppm) and may not require techniques such as polymer flooding.

TABLE 4

Well production before and after applying a waterflood on a section of an oil field using the Approach 3 screening criteria.

|  | Before | After |
|---|---|---|
| Oil Rate, Barrels of Oil Per Day ("BOPD") | 27.6 | 70.4 |

Miscible $CO_2$/Gas Flooding (Secondary/Tertiary Applications—Tertiary more common): The goal of EOR processes may be to mobilize the "residual" oil throughout the entire reservoir. This may be achieved by enhancing microscopic oil displacement and volumetric sweep efficiencies. $CO_2$ miscible flooding may have the greatest potential among gas flooding processes because of miscibility characteristics in comparison with other gases. $CO_2$ flooding may be carried out by injecting large quantities of $CO_2$ (e.g., 50% or more of the hydrocarbon pore volume) into the reservoir. Although $CO_2$ may not be truly miscible with the crude oil, the $CO_2$ may extract the light-to-intermediate components from the oil, and if the pressure is high enough, may develop miscibility to displace the crude oil from the reservoir. At reservoir conditions, $CO_2$ may be generally soluble in crude oils. It may swell the volume of the oil and reduces its viscosity even before miscibility is achieved by vaporizing gas drive mechanism. As miscibility is approached, as a result of multiple contacts, both the oil phase and $CO_2$ phase (containing intermediate oil components) can flow together because of the low interfacial tension. One of the requirements of the development of miscibility between the oil and $CO_2$ may be the reservoir pressure. $CO_2$ may recover crude oil by generation of miscibility; swelling the crude oil; lowering the viscosity of the crude oil; and/or lowering the interfacial tension between oil and the $CO_2$-oil phase in the near-miscible regions.

Table 5 includes screening criteria (applicable ranges) for an enhanced oil recovery technique (miscible $CO_2$/gas flooding).

TABLE 5

Screening criteria for miscible $CO_2$/gas flooding.

| | |
|---|---|
| Oil Gravity, °API | >25 (preferably >30) |
| Oil Viscosity, cP | <15 (preferably <10) |
| Fluid Composition | High percentage of intermediate hydrocarbons; ($C_5$-$C_{20}$), especially $C_5$-$C_{12}$ >15% |
| Oil Saturation, % PV | >30 |
| Net Thickness, ft. | Relatively thin unless formation is steeply dipping. |
| Depth, ft. | Deep enough to allow high enough pressure (>about 2,000 ft.). Pressure required for optimum production (sometimes called minimum miscibility pressure) ranges from about 1,200 psi for a high gravity (>30° API) crude at low temperatures to over 4,500 psi for heavier crudes at higher temperature. |
| Temperature, ° F. | Not critical but pressure required increases with temperature. |
| K, md | Not critical but pressure required depends upon reservoir continuity. |

Figure 5:
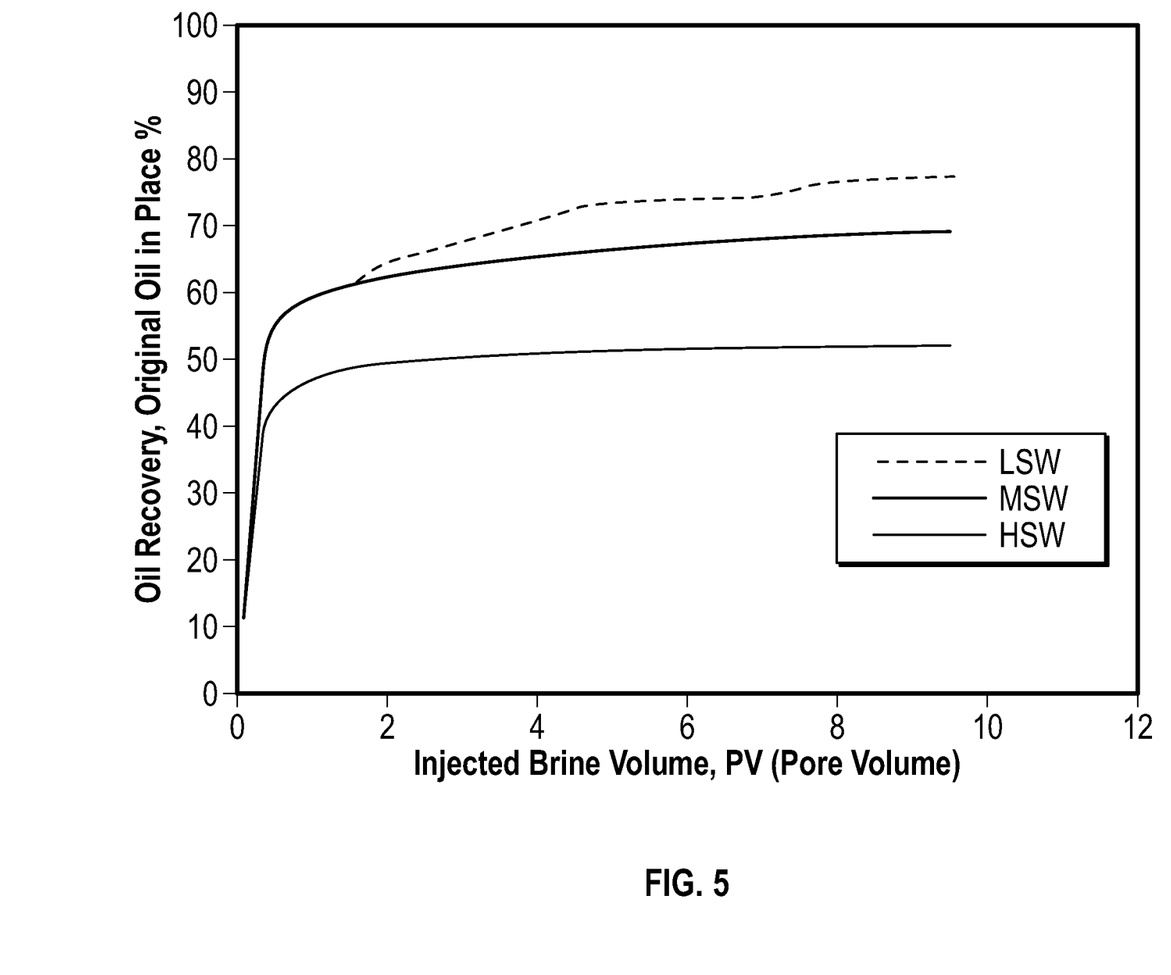
FIG. 5 illustrates a graph showing waterflood recovery (%) vs. pore volume ("PV") in accordance with embodiments of the disclosure.
Figure 6:
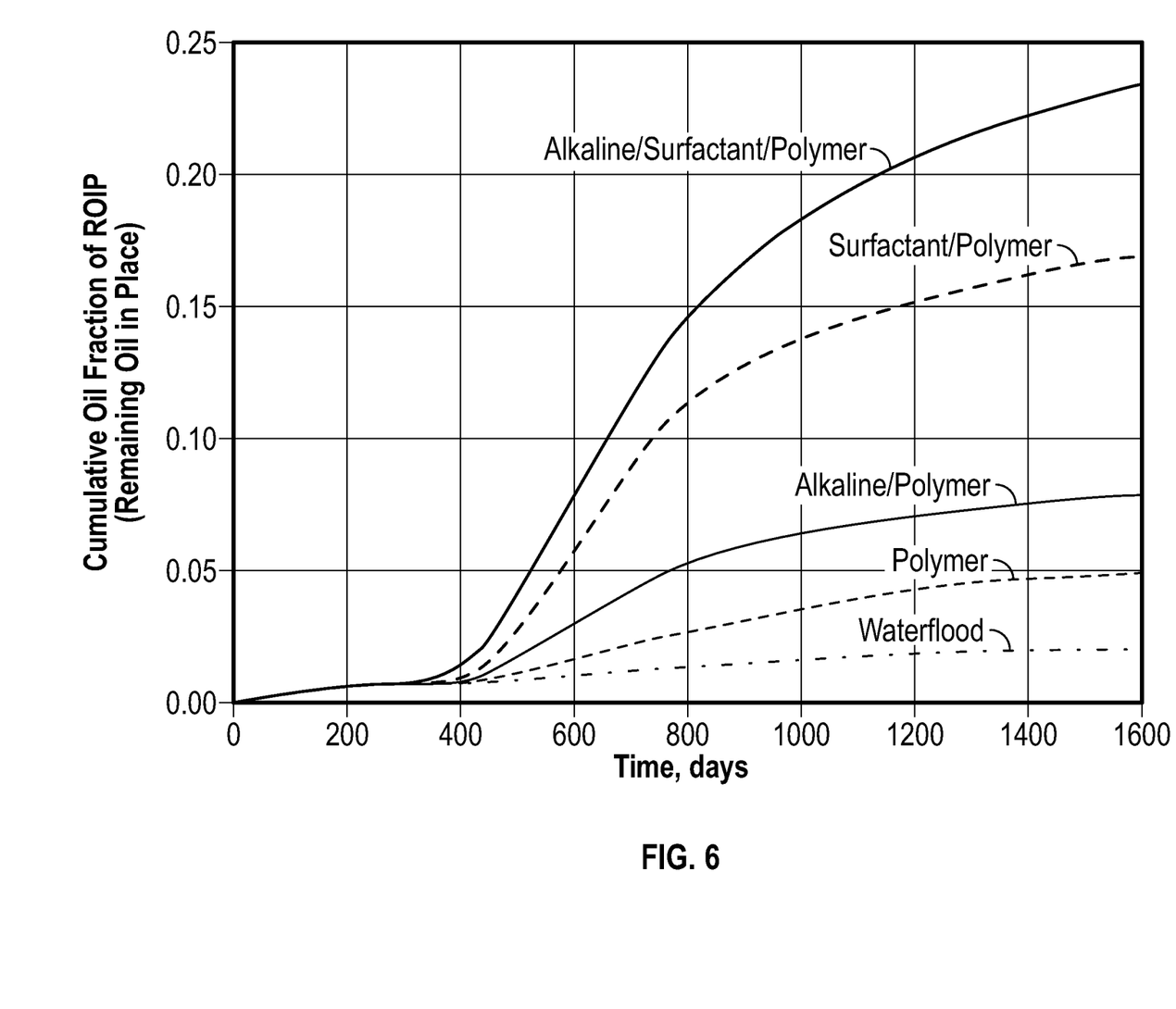
FIG. 6 illustrates a graph comparing oil recovery for different IOR processes in accordance with embodiments of the disclosure.

It may be important to note that the miscible displacement overcomes the capillary forces which otherwise retain oil in the pores of the rock. When $CO_2$ is in contact with the crude oil, some of the hydrocarbon components may be vaporized, as shown in FIGS. 5 and 6.

Limitations of miscible $CO_2$/Gas flooding may include low viscosity of $CO_2$ that may result in poor mobility control (e.g., water-alternating gas ("WAG") may help create more favorable mobility control); and availability of $CO_2$.

Problems with miscible $CO_2$/gas flooding may include early breakthrough of $CO_2$; corrosion in the producing wells; necessity of separating $CO_2$ from saleable hydrocarbons; repressurizing/repressuring of $CO_2$ for recycling; high requirement of $CO_2$ per incremental barrel of oil produced; High mobility of $CO_2$; requires modification with the surface facilities to account for reinjection.

Matters that may need to be addressed for miscible $CO_2$/Gas flooding may include: 1. Lab work to check characteristics that are similar to the field under study; 2. Simulation model with five spot or other well patterns (e.g., pattern of injection wells and/or production wells) to simulate a pilot test for checking the optimum parameters needed for an effective flood performance, and whether water-alternating-gas ("WAG") is needed for an optimum recovery; 3. Field pilot test on a small area needs to be performed or actual data analytics to develop a proper approach for screening $CO_2$-EOR processes; 4. Water is generally injected with the $CO_2$ in a WAG mode to improve a mobility ratio between the displacing phase and the oil, thus improving sweep efficiency; 5. Comprehensive and sensitivity analysis for deciding the optimum WAG ratio and number of cycles required; 6. Reinjection of the produced $CO_2$; and 7. Continuous supply of $CO_2$.

Low Salinity (Secondary/Tertiary Applications): Low-salinity waterflooding ("LSW") or low-salinity brine ("LSB") may be considered perhaps the most inexpensive EOR approach. The injection of low-salinity water may increase oil recovery in some cases. Low salinity flooding can alter the salinity and ionic composition of the injected water. This alteration may have a potential of creating huge impacts on wettability towards a water-wet state for some rocks and connectivity among pore spaces. The dilution of sea water may be an alternative to the use of fresh water in the injection process which may lead to huge economic impact on the recoverable hydrocarbons. FIG. 5 illustrates a plot of Oil Recovery against Injected Brine Volume (Pore Volume, "PV"). As shown, LSW may increase the oil recovery by about 5% compared to a Medium Salinity Waterflood ("MSW"), and increase the oil recovery by about 10% compared to a High Salinity Waterflood ("HSW"). The concentration of salinity may vary based on reservoir conditions: pressure, temperature, salinity, pH, and/or wettability. LSW may recover oil by mobility enhancement; altering the wettability of the reservoir rock; improving microscopic efficiency; improving injectivity due to lower suspended solids content; reducing corrosivity; and mitigating reservoir scaling and souring risks.

Table 6 includes screening criteria (applicable ranges) for an enhanced oil recovery technique (low salinity waterflooding (LSW)):

TABLE 6

Screening Criteria for LSW.

| | |
|---|---|
| Oil Gravity, °API | Light crude oil (preferred 30+) |
| Oil Viscosity, cP | Prefers lower oil viscosity (≤5 cP) |
| Formation Type | Sandstones are preferred; Carbonates need to be investigated. |
| Net Thickness, ft. | >30 |
| Depth, ft. | <9,000 |
| Temperature, ° F. | <190 |
| Permeability, md | 50+ |

TABLE 6-continued

Screening Criteria for LSW.

| | |
|---|---|
| Initial wettability state | Mixed/oil-wet (should not be strongly water-wet) |
| Clay content, % | <30 |
| Injection water salinity, ppm | Low (1,000-2,000) |
| Formation Salinity, ppm | Moderate formation water salinity (30,000+) |
| Polar compounds in the oil | Presence of polar components |

Limitations for LSW may include the availability of fresh water; formation water should contain divalent ions; and reservoir oil should have polar components. Problems with LSW may include fines migration and permeability reduction.

Matters that may need to be addressed with LSW may include: 1. Specific Lab work (e.g., core flood, sand pack) then followed by a pilot test with multi-well pattern setup to check characteristics that are similar to the field under study; 2. Simulation model with five spot or other well patterns to simulate a pilot test for checking the optimum salinity ratio (i.e., the ratio of the salinity of the injection water to the salinity of the initial formation water) needed for an optimum flood performance; 3. Field pilot test on a small area should be performed or actual data analytics may be needed to develop a proper approach for screening the low-salinity-water; 4. Study of the economics of desalination techniques to use seawater rather than use of fresh water, if applicable; and 5. Study of the mix between a low-concentration-polymer with low-salinity water.

Polymer Flooding (Secondary & Tertiary Applications): polymer flooding may provide better displacement (mobility ratio) and volumetric sweep efficiencies during a waterflood. Polymer augmented waterflooding may include adding water soluble polymers to water before it is injected into the reservoir. Low concentrations (e.g., 250-2,000 mg/L) of certain synthetic or biopolymers may be used; properly sized treatments may require 15-25% reservoir PV. FIG. 6 shows a comparison between alkaline, surfactant, and polymer use versus only waterflood.

Polymers may increase recovery by increasing the viscosity of the water; decreasing the mobility of the water; contacting a larger part of the reservoir; and/or reducing the injected fluid mobility to improve areal and vertical sweep efficiencies. Polymers may not lower the residual oil saturation. Table 7 includes screening criteria (applicable ranges) for an enhanced oil recovery technique (e.g., polymer flooding).

TABLE 7

Screening criteria for polymer flooding.

| | |
|---|---|
| Oil Gravity, °API | >20 |
| Oil Viscosity, cP | <150 (now extending to higher viscosities if permeability is high, e.g., in darcies) |
| Fluid Composition | Not critical (any crude oil composition is acceptable). |
| Oil Saturation, % | >10% PV mobile oil |
| Formation Type | Sandstones preferred but can be used in carbonates. |
| Net Thickness | Not critical. |
| Depth, ft. | <9,000 |
| T, °F. | <200 to minimize degradation (polymers are now available that can function at higher temperatures) |
| K, md | >100 (higher than 1,000 md in sandstone reservoirs may be better) Lower permeability should be avoided, higher molecular weight polymer may not be able to propagate through these rocks. |
| Ø, % | ≥20 (but this may not be a major factor) |

Limitations of polymer flooding may include: 1. If oil viscosity is high, a higher polymer concentration may be needed to achieve the desired mobility control; 2. Results may normally be better if the polymer flood is started before the water oil ratio becomes excessively high; 3. Clays may increase polymer adsorption; and 4. Some heterogeneities may be acceptable, but for conventional polymer flooding, reservoirs with extensive fractures should be avoided. If fractures are present, the crosslinked or gelled polymer techniques may be applicable. Problems with polymer flooding may include lower infectivity than with water can adversely affect the oil production rate in the early stages of the polymer flood; acrylamide-type polymers may lose viscosity due to shear degradation, or with increases in salinity and divalent ions; xanthan gum polymers may cost more, may be subject to microbial degradation, and may have a greater potential for wellbore plugging; shear degradation of polyacrylamides in some injection wells; long-term stability under reservoir conditions; polymer bacteria degradation due to salinity, temperature, time, shear rates, and/or presence of divalent ions; and polymers may not be effective in mature fields due to low mobile oil saturation.

Matters that may need to be addressed with polymer flooding may include 1. Lab work should be performed to check the flooding behavior in the field. Compare the performance with other similar fields where polymer flooding may have been applied successfully; 2. Simulation model with five spot or other well patterns to simulate a pilot test for checking the optimum parameters needed for an efficient flood performance; 3. Field pilot test on a small scale may be needed or actual data analysis for a similar field with polymer flood—a preferred approach for screening polymer flood EOR; and 4. Polymer may be used for conformance applications of the injected wells (near wellbore treatment) to modify vertical profiles (verify the injection pressure is below the fracturing pressure).

Surfactant/polymer Flooding (Tertiary Applications): Surfactant/polymer flooding, also called micellar/polymer or microemulsion flooding, may include injecting a slug that contains water, surfactant, electrolyte (salt), usually a co-solvent (alcohol), and possibly a hydrocarbon (oil). The size of the slug may be 5-15% PV for a high surfactant concentration system and 15-50% PV for low concentrations. The surfactant slug may be followed by polymer-thickened water. Concentrations of the polymer may range from 500-2,000 mg/L; the volume of the polymer solution injected may be 50% PV, or more or less, depending on the process design.

Surfactant/polymer flooding may recover oil by lowering the interfacial tension between oil and water; solubilization of oil; emulsification of oil and water; mobility enhancement; and/or alter the wettability of the reservoir rock.

Table 8 includes screening criteria (applicable ranges) for an enhanced oil recovery technique (surfactant/polymer flooding).

TABLE 8

Screening criteria for surfactant/polymer flooding.

| | |
|---|---|
| Oil Gravity, °API | >25 |
| Oil Viscosity, cP | <30 |
| Fluid Composition | Light intermediate may be desirable. |
| Oil Saturation, % PV | >40 |
| Formation Type | Sandstones are preferred |
| Net Thickness, ft. | >10 |
| Average Permeability, md | >20 (>100 may be preferred) |
| Depth, ft. | <8,000 |
| Temperature, ° F. | <175 |

Limitations of surfactant polymer flooding may include: 1. An areal sweep of more than 50% and higher permeability (>100 md) for waterflood may be desired; 2. Relatively homogenous formation may be preferred; 3. High amounts of anhydrite, gypsum, or clays may be undesirable; 4. Available systems may provide optimum behavior over a very narrow set of conditions; 5. With commercially available surfactants, formation water chlorides should be <20,000 ppm and divalent ions ($Ca^{++}$ and $Mg^{++}$)<500 ppm; and 6. A pre-flush may be needed to modify the salinity and hardness of formation to adapt the injected micellar slug. A pilot test may be needed to check applicability of this idea. Surfactant polymer flooding may recover about 15% oil. It should be noted that commercial applications may be still limited at this time. Problems with surfactant polymer flooding may include: complex and expensive system; possibility of chromatographic separation of chemicals; high adsorption of surfactant; interactions between surfactant and polymer; and/or degradation of chemicals at high temperatures.

Matters that may need to be addressed with surfactant polymer flooding may include: 1. Lab work (core flood, sand pack, and pilot test well pattern setup) to check characteristics that may be similar to the field under study; 2. Simulation model with five spot or other well patterns to simulate a pilot test for checking the optimum parameters needed for an optimum flood performance; 3. Field pilot test on a small area may need to be performed or actual data analytics may be needed to come up with a proper approach for screening EOR approaches versus surfactant; 4. The selection of the optimum surfactant materials; and 5. Testing stability of the surfactant over a wider range of reservoir temperatures and pressures.

FIG. 6 illustrates a plot of Remaining Oil In Place ("ROIP") (as a fraction) against Time (days) for Alkaline-Surfactant-Polymer injection; Surfactant-Polymer Injection; Alkaline-Polymer Injection; Polymer Injection; and Waterflooding (water injection).

Systems and methods of the disclosure may be implemented by a computer system. For purposes of this disclosure, a computer system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an computer system may be a personal computer or tablet device, a cellular telephone, a network storage device, or any other suitable device and may vary in size, shape, performance, functionality, and price. The computer system may include random access memory ("RAM"), one or more processing resources such as a central processing unit ("CPU") or hardware or software control logic, ROM, and/or other types of nonvolatile memory. Additional components of the computer system may include one or more disk drives, one or more network ports for communication with external devices as well as various input and output (I/O) devices, such as a keyboard, a mouse, and a video display. The computer system also may include one or more buses operable to transmit communications between the various hardware components.

The computer system may also include computer-readable media. Computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

In a first embodiment, an advanced method for screening enhanced and improved oil recovery in hydrocarbons reservoirs may comprise inputting into a computer system data related to properties of a hydrocarbon reservoir and depletion of the hydrocarbon reservoir; calculating, with the computer system, a current oil saturation and a current gas saturation of the hydrocarbon reservoir based on the data; determining and comparing, with the computer system, that the current reservoir pressure is less than a bubble point pressure based on the data; calculating, with the computer system, a time to repressurize/repressure the hydrocarbon reservoir by waterflooding based on the data; comparing, with the computer system, the data related to properties of the hydrocarbon reservoir to enhanced oil recovery screening criteria; selecting a flooding technique from a plurality of flooding techniques, with the computer system, based on satisfying the oil recovery screening criteria with the data related to properties of the hydrocarbon reservoir; and flooding the hydrocarbon reservoir.

A second embodiment can include the method of the first embodiment further comprising: determining, with the computer system, that the waterflooding is effective based on the oil saturation, wherein the oil saturation is greater than 40%; increasing reservoir pressure, wherein an instantaneous voidage replacement ratio ("VRR") is greater than or equal to one, wherein the VRR is computed using a current producing gas-oil ratio (GOR); and decreasing the GOR. VRR is defined as the ratio of a volume of injected fluid to a volume of the produced fluid.

A third embodiment can include the method of any of the preceding embodiments, further comprising determining, with the computer system, that the waterflooding is effective based on the gas saturation, wherein the gas saturation is less than 30%.

A fourth embodiment can include the method of any of the preceding embodiments, wherein the oil recovery screening criteria comprises: American Petroleum Institute (API) gravity, oil viscosity, fluid composition, oil saturation, formation type, formation thickness, formation depth, down hole temperature, wettability, clay content, injection water salinity, formation salinity, polar compounds, and/or formation permeability.

A fifth embodiment can include the method of any of the preceding embodiments, further comprising accepting, with the computer system, an input including a depositional environment; and defining and quantifying, with the computer system, geologic heterogeneities of the hydrocarbon reservoir, wherein quantification of lateral and vertical facies variation(s) of the geologic heterogeneities is based on the input. Geologic heterogeneities may include various lateral and/or vertical facies.

A sixth embodiment can include the method of any of the preceding embodiments, further comprising calculating, with the computer system, a number of wells for waterflooding.

A seventh embodiment can include the method of any of the preceding embodiments, wherein the plurality of flooding techniques comprise gas flooding, brine flooding, polymer flooding, surfactant polymer flooding, or combinations thereof.

An eighth embodiment can include the method of any of the preceding embodiments, wherein the flooding the hydrocarbon reservoir comprises flooding the hydrocarbon reservoir until fluid produced from the hydrocarbon reservoir contains at least 90% water.

A ninth embodiment can include the method of any of the preceding embodiments, further comprising recovering oil from the hydrocarbon reservoir.

In a tenth embodiment, a method for screening enhanced oil recovery (e.g., gas including $CO_2$) may comprise calculating, with a computer system, a current oil saturation of a reservoir; comparing, with the computer system, reservoir properties to screening criteria; determining, with the computer system, a minimum miscibility pressure based on correlations between the reservoir properties and the screening criteria; determining, with the computer system, that the minimum miscibility pressure is greater than a bubble point pressure of the reservoir and is less than or equal to an initial reservoir pressure; determining, with the computer system, a time to repressurize/repressure the reservoir with water injection; performing a reservoir simulation with the computer system; and flooding the reservoir.

An eleventh embodiment can include the method of the tenth embodiment, wherein the screening criteria comprises an oil API gravity greater than 25; oil viscosity less than 10 centipoise (cP); a high $C_5$ through $C_{12}$ composition (of oil); a depth greater than 2,000 feet; formation type; and formation thickness. A high $C_5$ through $C_{12}$ composition may include a composition of $C_5$ through $C_{12}$ that is greater than 15% (by weight of the oil); a low $C_5$ through $C_{12}$ composition (of oil) may include a composition of $C_5$ through $C_{12}$ that is less than 10% (by weight of the oil).

A twelfth embodiment can include the method of the tenth or eleventh embodiment, further comprising selecting a gas flooding technique from a plurality of flooding techniques, with the computer system, based on the oil saturation, wherein the oil saturation is greater than 30%.

A thirteenth embodiment can include the method of any one of the tenth through twelfth embodiments, wherein the oil recovery screening criteria comprises: American Petroleum Institute (API) gravity, oil viscosity, fluid composition, oil saturation, formation type, formation thickness, formation depth, down hole temperature, wettability, clay content, injection water salinity, formation salinity, polar compounds, and/or formation permeability.

A fourteenth embodiment can include the method of any one of the tenth through thirteenth embodiments, wherein the flooding the reservoir comprises flooding the reservoir until fluid produced from the reservoir contains at least 90% water.

A fifteenth embodiment can include the method of any one of the tenth through fourteenth embodiments, further comprising recovering oil from the reservoir.

In a sixteenth embodiment, a method for screening enhanced and improved oil recovery may comprise inputting into a computer system depletion data and rock and fluid properties of a reservoir; computing, with the computer system, a difference between a producing current gas-oil ratio and a solution gas-oil ratio to provide a free gas oil ratio; referring, with the computer system, to a gas-oil relative permeability curve of the reservoir; matching, with the computer system, the free gas oil ratio to a gas saturation on the gas-oil relative permeability curve to provide a free gas saturation; calculating, with the computer system, a current oil saturation of the hydrocarbon reservoir; determining, with the computer system, that the current reservoir pressure is less than a bubble point pressure; calculating, with the computer system, a time to repressurize/repressure the hydrocarbon reservoir by waterflooding; calculating, with the computer system, a number of wells for waterflooding; comparing, with the computer system, the data related to properties of the hydrocarbon reservoir to oil recovery screening criteria; selecting a flooding technique from a plurality of flooding techniques, with the computer system, based on satisfying the oil recovery screening criteria with the data related to properties of the hydrocarbon reservoir; flooding the reservoir; and recovering oil from the reservoir.

A seventeenth embodiment can include the method of the sixteenth embodiment, wherein the free gas oil ratio is a mobility ratio of gas to oil multiplied by a ratio of a formation value factor of oil to a formation value factor of gas.

An eighteenth embodiment can include the method of the sixteenth or seventeenth embodiment, further comprising accepting, with the computer system, an input including a depositional environment; and defining and quantifying, with the computer system, geologic heterogeneities of the hydrocarbon reservoir, wherein quantification of lateral and vertical facies variation(s) of the geologic heterogeneities is based on the input.

A nineteenth embodiment can include the method of any one of the sixteenth through eighteenth embodiments, wherein the plurality of flooding techniques comprise gas flooding, brine flooding, polymer flooding, surfactant polymer flooding, or combinations thereof.

A twentieth embodiment can include the method of any one of the sixteenth through nineteenth embodiments, wherein the flooding the reservoir comprises flooding the reservoir until fluid produced from the reservoir contains at least 90% water.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

What is claimed is:

1. A method for recovering oil from hydrocarbon reservoirs comprising:
inputting into a computer system data related to properties of a hydrocarbon reservoir and depletion of the hydrocarbon reservoir;
calculating, with the computer system, a current oil saturation ($S_o$) and a current gas saturation ($S_g$) of the hydrocarbon reservoir based on the data, and utilizing the current oil saturation and the current gas saturation to determine if waterflooding could provide enhanced oil recovery, wherein the current gas saturation is calculated by:
(a) calculating the current oil saturation ($S_o$) from a material balance equation as: $S_o=(1-S_w)(1-Np/N)(B_o/B_{Oi})$, where $S_w$ is the water saturation at start of a waterflood; NP is the cumulative oil production at start of waterflood; N is the initial oil in place in stock tank barrels (STB); $B_0$ is the initial oil formation volume factor ("FVF"), in reservoir barrels (RB) per STB); $B_{Oi}$ is the oil FVF at a start of the waterflood in RB/STB, and calculating Sg as $S_g=1-S_w-S_o$; and
(b) calculating free gas saturation ($S_g$) from a free gas-oil ratio ("GOR"); and
(c) comparing the two calculated $S_g$ values as a quality check of pressure, volume, temperature (PVT) data;
if the current oil saturation ($S_o$) is less than 0.4 and the current gas saturation ($S_g$) as calculated by (a) and (b) is less than 0.3, determining and comparing, with the computer system, a current reservoir pressure to a bubble point pressure and an initial pressure and, if the current reservoir pressure is less than the bubble point pressure and the initial pressure based on the data, calculating, with the computer system, a time to repressure the hydrocarbon reservoir by waterflooding based on the data;
if the current reservoir pressure is not less than the bubble point pressure and the initial pressure or if the time is less than 5 years, comparing, with the computer system, the data related to properties of the hydrocarbon reservoir to enhanced oil recovery screening criteria for the data related to properties of the hydrocarbon reservoir;
selecting a flooding technique from a plurality of flooding techniques, with the computer system, based on finding that the data related to properties of the hydrocarbon reservoir satisfy the oil recovery screening criteria of the flooding technique; and
flooding the hydrocarbon reservoir with the flooding technique.

2. The method of claim 1, further comprising:
if current reservoir pressure is less than the bubble point pressure and the initial pressure, increasing reservoir pressure, wherein an instantaneous voidage replacement ratio (VRR) is greater than or equal to one, wherein the VRR is computed with a current producing gas-oil ratio (GOR); and
decreasing the GOR.

3. The method of claim 1, wherein the oil recovery screening criteria comprises: American Petroleum Institute (API) gravity, oil viscosity, fluid composition, oil saturation, formation type, formation thickness, formation depth, down hole temperature, wettability, clay content, injection water salinity, formation salinity, polar compounds, and/or formation permeability.

4. The method of claim 1, further comprising accepting, with the computer system, an input including a depositional environment; and
defining and quantifying, with the computer system, geologic heterogeneities of the hydrocarbon reservoir, wherein quantification of lateral and vertical facies variation of the geologic heterogeneities is based on the input.

5. The method of claim 1, further comprising calculating, with the computer system, a number of wells for waterflooding.

6. The method of claim 1, wherein the plurality of flooding techniques comprise gas flooding, brine flooding, polymer flooding, surfactant polymer flooding, or combinations thereof.

7. The method of claim 1, wherein the flooding the hydrocarbon reservoir comprises flooding the hydrocarbon reservoir until fluid produced from the hydrocarbon reservoir contains at least 90% water.

8. The method of claim 1, further comprising recovering oil from the hydrocarbon reservoir.

* * * * *